United States Patent
Yun et al.

(10) Patent No.: US 10,408,680 B2
(45) Date of Patent: Sep. 10, 2019

(54) APPARATUS FOR OPTICAL EMISSION SPECTROSCOPY

(71) Applicant: Industry-Academic Cooperation Foundation, Yonsei University, Seoul (KR)

(72) Inventors: Ilgu Yun, Seoul (KR); Sang Myung Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 235 days.

(21) Appl. No.: 15/008,856

(22) Filed: Jan. 28, 2016

(65) Prior Publication Data
US 2016/0216155 A1 Jul. 28, 2016

(30) Foreign Application Priority Data
Jan. 28, 2015 (KR) .................. 10-2015-0013650

(51) Int. Cl.
 *C23C 16/50* (2006.01)
 *G01J 3/443* (2006.01)
 (Continued)

(52) U.S. Cl.
 CPC .............. *G01J 3/443* (2013.01); *G01J 3/0208* (2013.01); *G01J 3/0216* (2013.01);
 (Continued)

(58) Field of Classification Search
 CPC ........ G01J 3/443; G01J 3/0235; G01J 3/0208; G01J 3/0216; G01J 3/0218;
 (Continued)

(56) References Cited

U.S. PATENT DOCUMENTS 5,322,590 A 6/1994 Koshimizu
5,728,253 A 3/1998 Saito et al.
(Continued)

FOREIGN PATENT DOCUMENTS

CN 101074921 A 11/2007
CN 101494159 A 7/2009
(Continued)

OTHER PUBLICATIONS

Wang et al., "Application of OES diagnostics on plasma etching": Infrared and Laser Engineering, Apr. 30, 2018.

*Primary Examiner* — Yuechuan Yu
(74) *Attorney, Agent, or Firm* — Harness, Dickey & Pierce, P.L.C.

(57) ABSTRACT

Provided is an apparatus for optical emission spectroscopy. The apparatus for the optical emission spectroscopy includes a light collection unit configured to collect light within a plasma process chamber in which plasma is generated to process a substrate, a light transmission unit configured to transmit the collected light, and an analysis unit configured to analyze the light provided through the light transmission unit, thereby analyzing a plasma state. The light collection unit includes a light collection part configured to concentrate the light generated in the plasma process chamber and provide the concentrated light to the light transmission unit.

12 Claims, 10 Drawing Sheets

(51) Int. Cl.
*G01J 3/02* (2006.01)
*H01J 37/32* (2006.01)

(52) U.S. Cl.
CPC .......... *G01J 3/0218* (2013.01); *G01J 3/0235* (2013.01); *H01J 37/32935* (2013.01); *H01J 37/32972* (2013.01)

(58) Field of Classification Search
CPC .......... H01J 37/32009; H01J 37/32972; H01J 37/32935; C23C 16/50
See application file for complete search history.

(56) References Cited

U.S. PATENT DOCUMENTS

| | | | | |
|---|---|---|---|---|
| 5,980,767 | A | * | 11/1999 | Koshimizu ......... B81C 1/00587 216/60 |
| 6,201,241 | B1 | * | 3/2001 | Koike ................... H01J 37/252 250/310 |
| 6,958,484 | B2 | | 10/2005 | Mitrovic |

FOREIGN PATENT DOCUMENTS

| | | | |
|---|---|---|---|
| JP | S61129555 | A | 6/1986 |
| JP | H04136746 | A | 5/1992 |
| JP | 06235068 | A * | 8/1994 |
| JP | H06340432 | A | 12/1994 |
| JP | H09213677 | A | 8/1997 |
| JP | 2011-071335 | A | 4/2011 |
| KR | 1995-0010713 | | 4/1995 |
| KR | 10-0152355 | B1 | 12/1998 |
| KR | 10-0170419 | B1 | 3/1999 |
| KR | 100304288 | B1 | 11/2001 |
| KR | 100374549 | B1 | 2/2003 |
| KR | 20030050098 | A | 6/2003 |
| KR | 10-2012-0127350 | A | 11/2012 |
| KR | 20140097745 | | 8/2014 |
| KR | 101487519 | B1 | 1/2015 |
| WO | WO-2005-045890 | A2 | 5/2005 |

* cited by examiner

APPARATUS FOR OPTICAL EMISSION SPECTROSCOPY

CROSS-REFERENCE TO RELATED APPLICATIONS

This U.S. non-provisional patent application claims priority under 35 U.S.C. § 119 of Korean Patent Application No. 10-2015-0013650, filed on Jan. 28, 2015, the entire contents of which are hereby incorporated by reference.

BACKGROUND

The present disclosure herein relates to an apparatus for optical emission spectroscopy, and more particularly, to an apparatus for optical emission spectroscopy that measures a plasma state within a plasma process chamber.

In terms of the miniaturization and the advancement of processes for manufacturing semiconductor devices and flat panel display devices, plasma substrate processing apparatuses are being used as apparatuses for performing an etching process, a chemical vapor deposition process, and the like. Such a plasma substrate processing apparatus, high-frequency energy is applied to a stage or electrode to form electric fields or magnetic fields within a plasma processing chamber and then generate plasma by the electromagnetic fields, thereby processing a substrate.

Plasma characteristics such as electron density and ion density within the chamber may be factors that have an influence on a process rate, homogeneity, uniformity, and wafer-to-wafer repeatability in the plasma processing process. For example, the electron density within the plasma processing chamber may have an influence on degrees of excitation, ionization, and dissociation. Thus, to effectively perform the plasma substrate processing process, it may be important to monitor a state within the plasma processing chamber and grasp a plasma state.

A method for obtaining characteristic variables with respect to the plasma state includes a method for measuring plasma density by using a plasma concentration measuring sensor, e.g., a Langmuir probe. In the method for measuring the plasma characteristics by using the Langmuir probe, a metal probe is inserted into the chamber in which a plasma atmosphere is formed, and power is applied to the metal probe to measure a change in current, thereby determining electron density due to the plasma.

In the contact-type measuring method, it may be difficult to measure the characteristics such as the plasma density in real time by inserting the metal probe into the chamber as needed. In addition, since the Langmuir probe directly contact the plasma within the chamber to analyze the plasma state, the Langmuir probe may be contaminated or damaged according to the plasma atmosphere, and also, when the Langmuir probe is introduced into the chamber, foreign substances may be introduced into the chamber.

FIG. 1 is a schematic view of an apparatus for optical emission spectroscopy, which is installed in a plasma process chamber 11 according to the related art, and FIG. 2 is a schematic plan view of the apparatus for the optical emission spectroscopy, which is installed in the plasma process chamber 11 according to the related art. Referring to FIGS. 1 and 2, an optical fiber 14 for the optical emission spectroscopy (OES) that is a technology for optically diagnosing a semiconductor plasma process is limited to an angle of about 30° to about 40° in light incident angle range A. Thus, in case of a wafer W having a size of about 12 inches, the plasma state may be measured on only an area corresponding to about 40% of an entire area of the wafer W. That is, the existing OES technology may have a limitation in that only a portion of the plasma that has an influence on the wafer W, but the whole plasma, is measured.

SUMMARY

The present disclosure provide an apparatus for optical emission spectroscopy, which is capable of uniformly analyzing a plasma state from a central portion to the outermost portion of a substrate to improve analysis performance with respect to the plasma state within a plasma process chamber.

The present disclosure also provide an apparatus for optical emission spectroscopy, in which a general abnormal state with respect to the entire region within a plasma process chamber is capable of being accurately measured, a plasma state is capable of being generally or locally analyzed in the plasma process chamber as needed, the plasma state is capable of being analyzed for each of various areas on a substrate, and the plasma state is capable of being coadaptationally and accurately analyzed on substrates having various sizes.

The objects of the inventive concept are not limited to the abovementioned objects. Other objects thereof will be clearly understandable by those skilled in the art from the following descriptions.

An embodiment of the inventive concept provides apparatuses for optical emission spectroscopy including: a light collection unit configured to collect light within a plasma process chamber in which plasma is generated to process a substrate; a light transmission unit configured to transmit the collected light; and an analysis unit configured to analyze the light provided through the light transmission unit, thereby analyzing a plasma state, wherein the light collection unit includes a light collection part configured to concentrate the light generated in the plasma process chamber and provide the concentrated light to the light transmission unit.

In an embodiment, the light collection part may expand an incident angle range of light that is incident from the inside of the plasma process chamber to concentrate the light.

In an embodiment, the light collection part may include a concave lens. In an embodiment, the concave lens may have a concave transverse section and a rectangular vertical section.

In an embodiment, the concave lens may have a structure in which a curvature thereof in a horizontal direction is greater than that thereof in a vertical direction.

In an embodiment, the light transmission unit may include an optical fiber.

In an embodiment, the apparatuses may further include a driving unit configured to move the light collection part to a front side of the light transmission unit or displace the light collection part from the front side of the light transmission unit.

In an embodiment, the apparatuses may further include a rotating unit configured to rotate the light collection part in a horizontal direction.

In an embodiment, the analysis unit may analyze a plasma state for each of rotational angles of the light collection part.

In an embodiment, the light collection part may include a plurality of light collectors having different light incident angle ranges corresponding to different sizes of a plurality of substrates, and the apparatus may further include a driving unit configured to move the light collector, which has a light incident angle range corresponding to the size of the substrate disposed in the plasma process chamber, of the plurality of light collectors to a front side of the light transmission unit.

In an embodiment, the light collection unit may include a plurality of light collection parts that are disposed at positions different from each other in the plasma process chamber, and the plurality of light collection parts may have light incident angle ranges corresponding to different sizes of substrates.

In an embodiment of the inventive concept, an apparatus for optical emission spectroscopy includes: a light collection unit configured to collect light within a plasma process chamber in which plasma is generated to process a substrate; and a light transmission unit configured to transmit the collected light to an analysis unit configured to analyze a plasma state, wherein the light collection unit include a light collection part configured to concentrate the light generated in the plasma process chamber and provide the concentrated light to the light transmission unit.

In an embodiment of the inventive concept, a plasma processing apparatus includes: a plasma process chamber in which plasma is generated to process a substrate; a light collection unit configured to collect light within the plasma process chamber; and a light transmission unit configured to transmit the collected light to an analysis unit configured to analyze a plasma state, wherein the light collection unit include a light collection part configured to concentrate the light generated in the plasma process chamber and provide the concentrated light to the light transmission unit.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
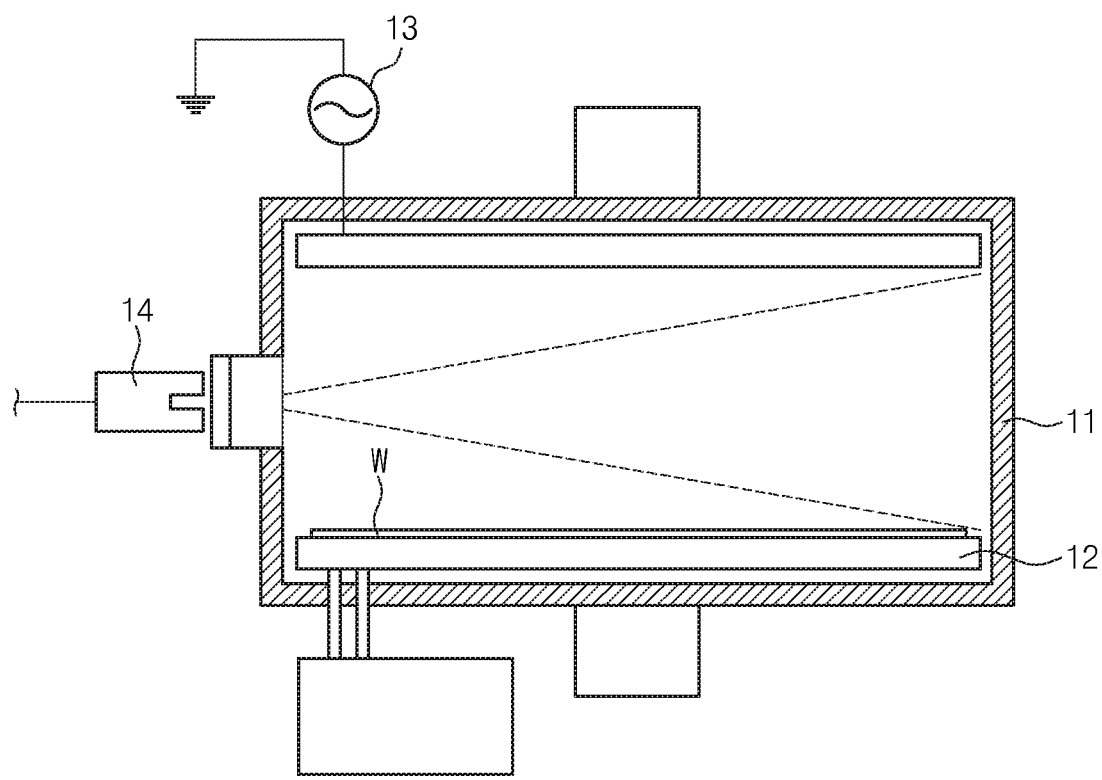
FIG. 1 is a schematic view of an apparatus for optical emission spectroscopy, which is installed in a plasma processing apparatus according to a related art.
Figure 2:
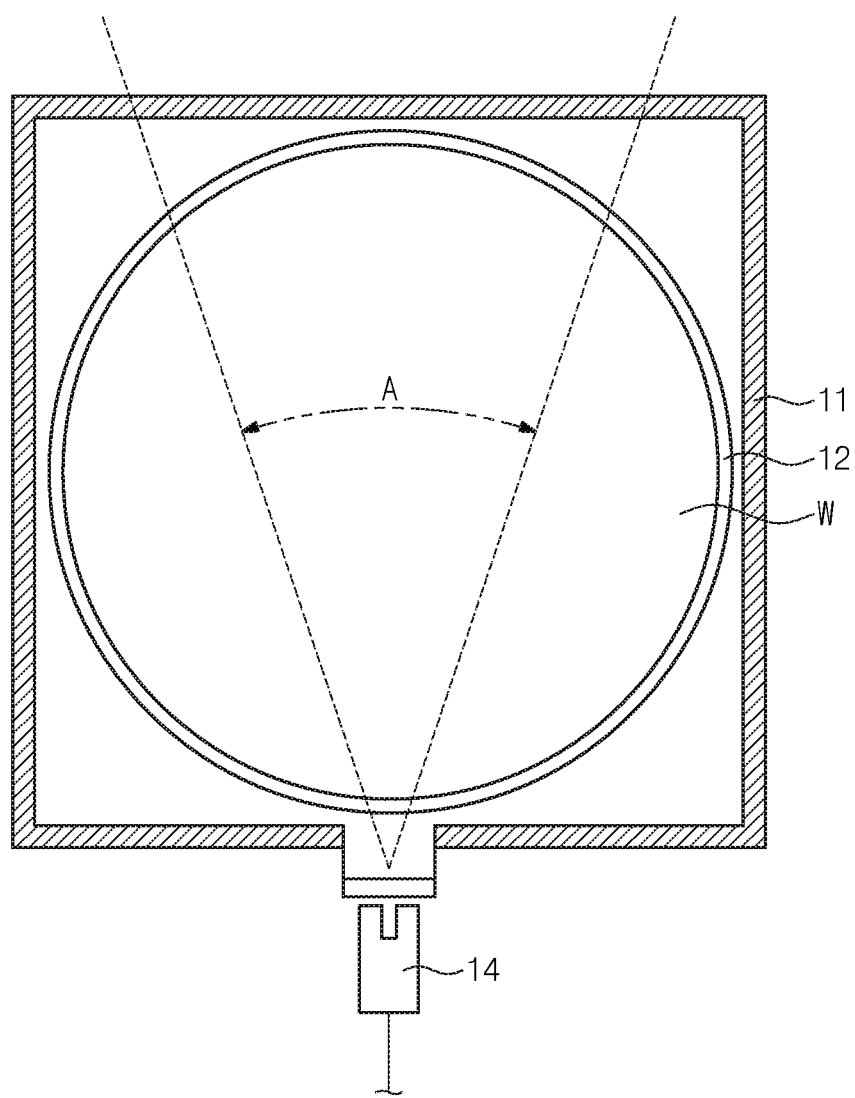
FIG. 2 is a schematic plan view of the apparatus for the optical emission spectroscopy, which is installed in the plasma processing apparatus according to the related art.

Advantages and features of the inventive concept, and implementation methods thereof will be clarified through following embodiments described with reference to the accompanying drawings. The present disclosure may, however, be embodied in different forms and should not be construed as limited to the embodiments set forth herein. Unless otherwise defined, all terms (including technical and scientific terms) used herein have the same meaning as generally understood by those skilled in the art. Moreover, detailed descriptions related to well-known functions or configurations will be ruled out in order not to unnecessarily obscure subject matters of the inventive concept. It is also noted that like reference numerals denote like elements in appreciating the drawings. A portion of components in the drawings may be exaggerated or reduced for helping understanding of the inventive concept.

In the following description, the technical terms are used only for explaining a specific exemplary embodiment while not limiting the inventive concept. The terms of a singular form may include plural forms unless referred to the contrary. The meaning of 'include' or 'comprise' specifies a property, a region, a fixed number, a step, a process, an element and/or a component but does not exclude other properties, regions, fixed numbers, steps, processes, elements and/or components.

An apparatus for optical emission spectroscopy (OES) according to an embodiment of the inventive concept may measure a plasma state within a plasma process chamber by using the OES that is a technology for optically diagnosing a semiconductor plasma process. A specifically processed lens may be inserted to the front of an existing optical fiber that collects only a portion of plasma light having an influence on a wafer to collect the light to a wide region within the plasma process chamber, thereby uniformly analyzing the plasma state from a central portion to the outermost portion of a substrate to improve analysis performance for the plasma state. In an embodiment of the inventive concept, to expand a light collection range, i.e., a light incident angle range within the plasma process chamber, a specifically processed concave lens may be inserted to the front of a light transmission unit (e.g., an optical fiber) to significantly expand a light collection angle.

The apparatus for the OES according to an embodiment of the inventive concept includes a light collection unit for collecting light within the plasma process chamber in which plasma is generated to process a substrate, a light transmission unit for transmitting the collected light, and an analysis unit for analyzing the light provided through the light transmission unit to analyze a plasma state. The light collection unit includes a light collection part that concentrates light generated in the plasma process chamber to provide the concentrated light to the light transmission unit. The light collection part may be provided as an optical element that expands a region of an incident angle of light incident from the inside of the plasma process chamber to collect the light, for example, a specifically processed concave lens. In an embodiment, to allow light directly above a top surface of the wafer to be uniformly incident, the concave lens may have a structure in which a curvature thereof in a horizontal direction is greater than that in a vertical direction.

In the apparatus for the OES according to an embodiment of the inventive concept, the plasma state within the chamber for each of various plasma processes such as semiconductor etching or deposition using plasma may be measured adequate for wafers having various sizes, and the plasma state may be uniformly maintained from a central portion to the outermost portion of the wafer to prevent the plasma from being lost without performing a separate additional process such as wafer scrap. Also, according to an embodiment of the inventive concept, in the existing OES, the specifically processed concave lens may be additionally inserted just to easily and accurately measure a general abnormal state in the entire region within the plasma process chamber.

The apparatus for the OES according to an embodiment of the inventive concept may include a driving unit for moving the light collection part to a front side of the light transmission unit or removing the light collection part from the front side of the light transmission unit. According to an embodiment of the inventive concept, a general plasma state in a wide region within the plasma process chamber may be analyzed, or a plasma state in a specific region may be locally analyzed as needed. In the apparatus for the OES according to another embodiment of the inventive concept may include a rotating unit for rotating the light collection part in a left/right direction. The analysis unit may analyze a plasma state for each of rotational angles of the light collection part. According to the embodiments, the plasma state may be analyzed for each of various areas of the wafer.

According to another embodiment of the inventive concept, the light collection part may include a plurality of light collectors having light incident angles different from each other to correspond to sizes of a plurality of substrates. The apparatus for the OES may include a driving unit for moving the light collector having a light incident angle corresponding to a size of the substrate to a front side of the light transmission unit. The light collection unit may include a plurality of light collection parts that are disposed at positions different from each other in the plasma process chamber, and the plurality of light collection parts may have light incident angles corresponding to substrates having sizes different from each other. According to the embodiments, the plasma state may be accurately analyzed with respect to the substrates having various sizes.

Figure 3:
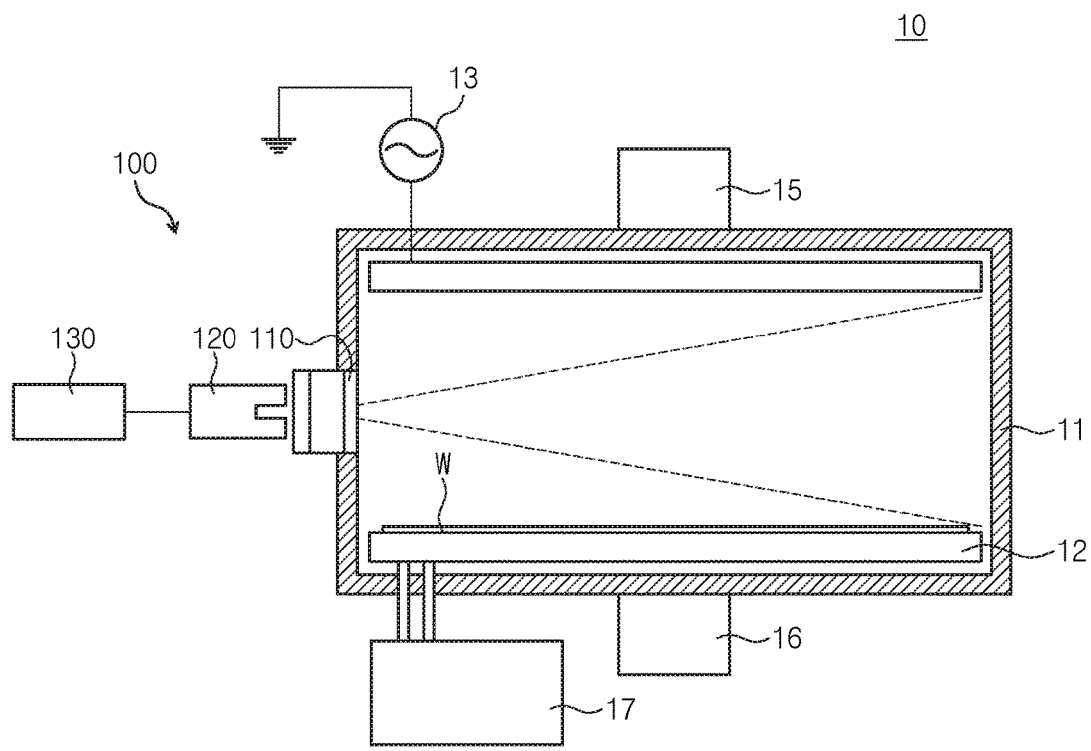
FIG. 3 is a schematic view of a plasma processing apparatus according to an embodiment of the inventive concept.
Figure 4:
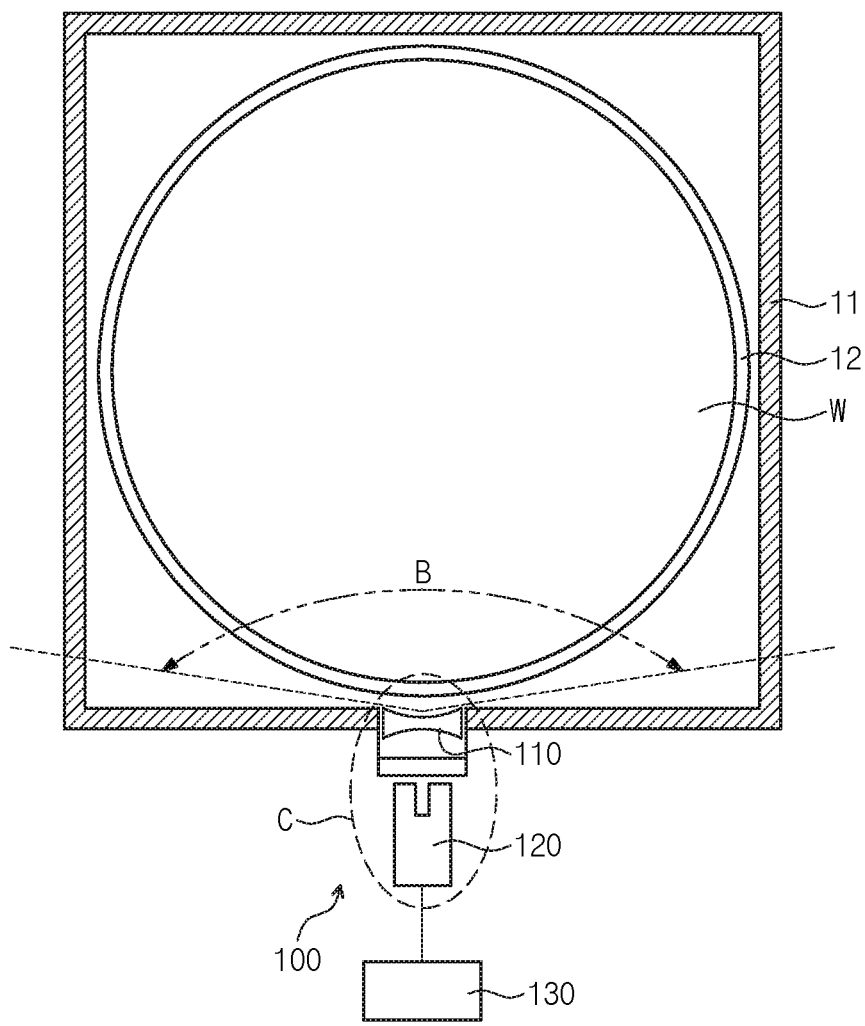
FIG. 4 is a schematic plan view of the plasma processing apparatus according to an embodiment of the inventive concept.

FIG. 3 is a schematic view of a plasma processing apparatus 10 according to an embodiment of the inventive concept, and FIG. 4 is a schematic plan view of the plasma processing apparatus 10 according to an embodiment of the inventive concept. Referring to FIGS. 3 and 4, the plasma processing apparatus according to an embodiment of the inventive concept includes a plasma process chamber 11 in which plasma is generated to process a substrate W and an apparatus 100 for optical emission spectroscopy (OES), which collects light within the plasma process chamber 11 to analyze a plasma state within the plasma process chamber 11 by using OES. For example, the substrate W may include a semiconductor substrate for manufacturing a semiconductor device and a glass substrate for manufacturing a flat panel display device, but is not limited thereto. A process for processing the substrate W may include an etching process, a chemical vapor deposition process, an ashing process, and a cleaning process, but is not limited thereto.

The plasma processing apparatus 10 may be provided as capacitive coupled plasma (CCP) equipment, inductive coupled plasma (ICP) equipment, microwave plasma equipment, or other various plasma processing apparatuses. The plasma process chamber 11 (hereinafter, referred to as a "chamber") may provide a space in which the substrate W is processed. The chamber 11 may have a sealed structure to maintain a vacuum state thereof. For example, the chamber 11 may have a hexahedral shape having a hollow, a cylindrical shape having a hollow, or other various shapes.

The chamber 11 has a gas supply hole 15 and a gas discharge hole 16. The gas supply hole 15 may be defined in a side surface or top surface of the chamber 11. A process gas for processing the substrate W may be supplied through the gas supply hole 15. When the gas supply hole 15 is defined in the top surface of the chamber 11, a shower head (not shown) for uniformly supplying the process gas onto the substrate W may be further provided in an inner upper portion of the chamber 11. The gas discharge hole 16 may be defined in a bottom surface of the chamber 11 or a lower portion of a side surface of the chamber 11. A non-reacted source gas and byproducts generated in the process of processing the substrate W may be discharged through the gas discharge hole 16.

A stage 12 may be disposed on a bottom surface inside the chamber 11 to support the substrate W. The stage 12 may have a flat plate shape. For example, the stage 12 may include an electrostatic chuck for fixing the substrate W by using electrostatic force. An RF power part 13 may be provided to apply radio frequency (RF) power for generating or controlling the plasma to an upper electrode. The RF power part 13 may be provided in one or plurality of power sources. The upper electrode may be disposed in an inner upper portion of the chamber 11 to face the stage 12. The upper electrode may be disposed parallel to the stage 12 and spaced a predetermined distance from the stage 12. A heater 17 for heating the substrate w to a temperature that is adequate for the plasma processing may be provided.

The RF energy may be applied into the chamber 11 by the RF power part 13 to form electric fields between the stage 12 and the upper electrode by a potential difference between the stage 12 and the upper electrode, and thus, plasma may be generated in the chamber 11. The density of the plasma formed on the substrate W may vary according to the potential difference between the stage 12 and the upper electrode. Thus, the RF of the RF power part 13 may be controlled to adjust the plasma state within the chamber 11.

To provide the light within the chamber 11 to the apparatus 100 for the OES that monitors the plasma state within the chamber 11, an opening may pass through one side of a wall of the chamber 11. A light transmission part 18 formed of, for example, quartz may be provided in the opening. The light transmission part 18 and the opening may be sealed therebetween so that the inside of the chamber 11 is maintained in the vacuum state to prevent foreign substances from being introduced into the chamber 11.

The apparatus 100 for the OES may be disposed on a sidewall of the chamber 11 so that the general plasma state with respect to the wide area on the top surface of the wafer W is analyzed. The apparatus 100 for the OES may be disposed on a position at which light in the region between the stage 12 and the upper electrode is capable of being collected through the light transmission part. The apparatus 100 for the OES may analyze the plasma state within the chamber 11 by using the OES from the outside of the chamber 11 so that the plasma does not have an influence on the inside of the chamber 11.

Figure 5:
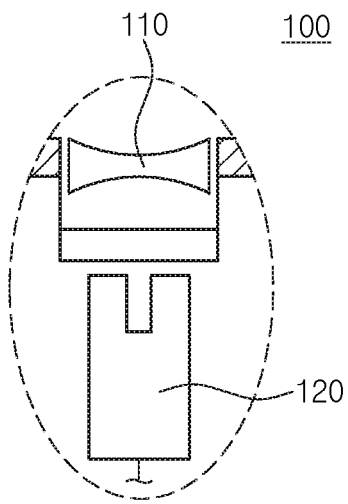
FIG. 5 is an enlarged view of a portion "C" of FIG. 4.

FIG. 5 is an enlarged view of a portion "C" of FIG. 4. Referring to FIGS. 3 to 5, the apparatus 100 for OES includes a light collection unit 110, a light transmission unit 120, and an analysis unit 130. The light collection unit 110 collects light within a plasma process chamber 11. The light collection unit 110 includes a light collection part that concentrates light generated in the plasma process chamber 11 to provide the concentrated light to the light transmission unit 120. The light collection part may be provided to expand a region of light to be provided to the light transmission unit 120, i.e., a range of an incident angle of the light within the chamber 11, which is provided to the light transmission unit 120. The light transmission unit 120 may transmit the light collected by the light collection unit 110 to the analysis unit 130. The light transmission unit 120 may include an optical fiber. The analysis unit 130 may analyze the light provided through the light transmission unit 120 to analyze the plasma state within the chamber 11.

Figure 6:
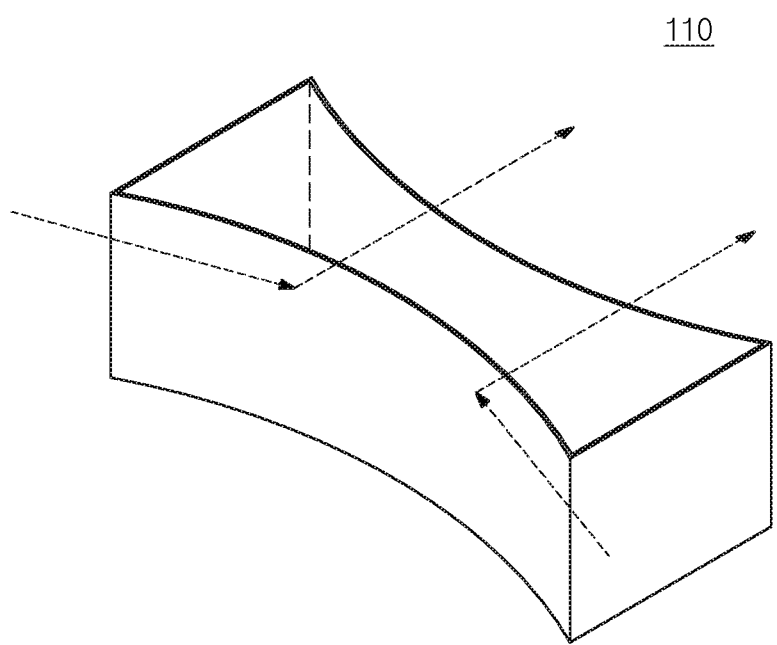
FIG. 6 is a view of a light collection unit constituting an apparatus for optical emission spectroscopy according to an embodiment of the inventive concept.
Figure 7:
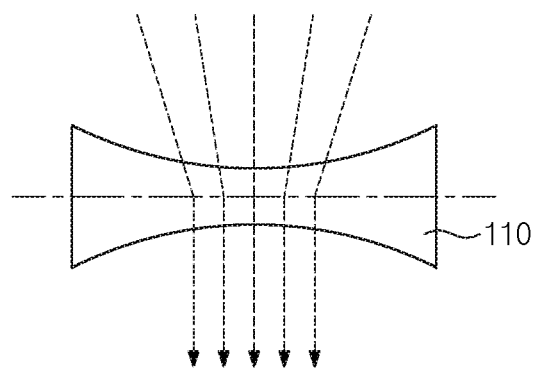
FIG. 7 is a plan view of the light collection unit constituting the apparatus for optical emission spectroscopy according to an embodiment of the inventive concept.
Figure 8:
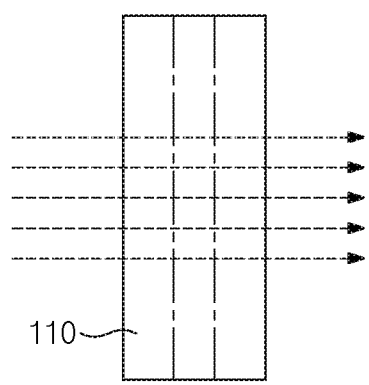
FIG. 8 is a side view of the light collection unit constituting the apparatus for optical emission spectroscopy according to an embodiment of the inventive concept.

FIG. 6 is a view of the light collection unit 110 constituting the apparatus 100 for OES according to an embodiment of the inventive concept, FIG. 7 is a plan view of the light collection unit 110 constituting the apparatus 100 for OES according to an embodiment of the inventive concept, and FIG. 8 is a side view of the light collection unit 110 constituting the apparatus 100 for OES according to an embodiment of the inventive concept. Referring to FIGS. 3 to 8, the light collection part constituting the light collection unit 110 may include a concave lens that is specifically processed. To prevent the lens from being contaminated and etched, the concave lens may be disposed outside a quartz plate (the light transmission unit). As illustrated in FIG. 6, the concave lens may have a structure in which a curvature thereof in a horizontal direction is greater than that in a vertical direction. The concave lens may have a concave transverse section and a rectangular vertical section. As illustrated in FIG. 4, the light collection part may expand a range B of an incident angle of light that is incident from the inside of the plasma process chamber 11 to collect the light.

According to an embodiment of the inventive concept, since the light in the wide region within the plasma process chamber 11 is collected by the light collection unit 110 including the light collection part for expanding the range of the light incident angle, the plasma state may be uniformly analyzed from a central portion to the outermost portion of the substrate W to improve analysis performance with respect to the plasma state.

Figure 9:
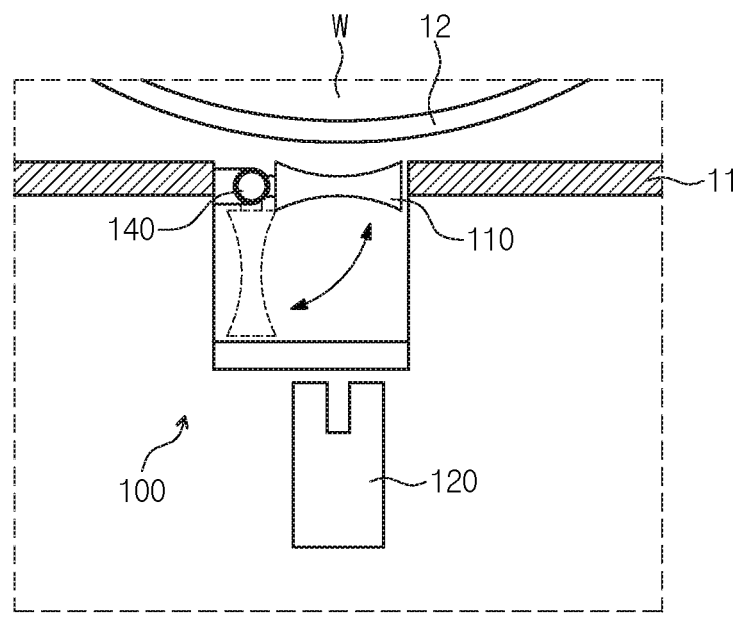
FIG. 9 is a view of an apparatus for optical emission spectroscopy according to another embodiment of the inventive concept.

FIG. 9 is a view of an apparatus 100 for OES according to another embodiment of the inventive concept. Referring to FIG. 9, the apparatus 100 for the OES may include a driving unit for moving a light collection part constituting a light collection unit 110 to a front side of a light transmission unit 120 or removing the light collection part from the front side of the light transmission unit 120. According to the embodiment of FIG. 9, a light collection part (a concave lens) may be moved to a front side of a light transmission unit or displaced from the front side of the light transmission unit to analyze a general plasma state in a wide region within a plasma process chamber or locally analyze a plasma state in a specific region as needed.

Figure 10:
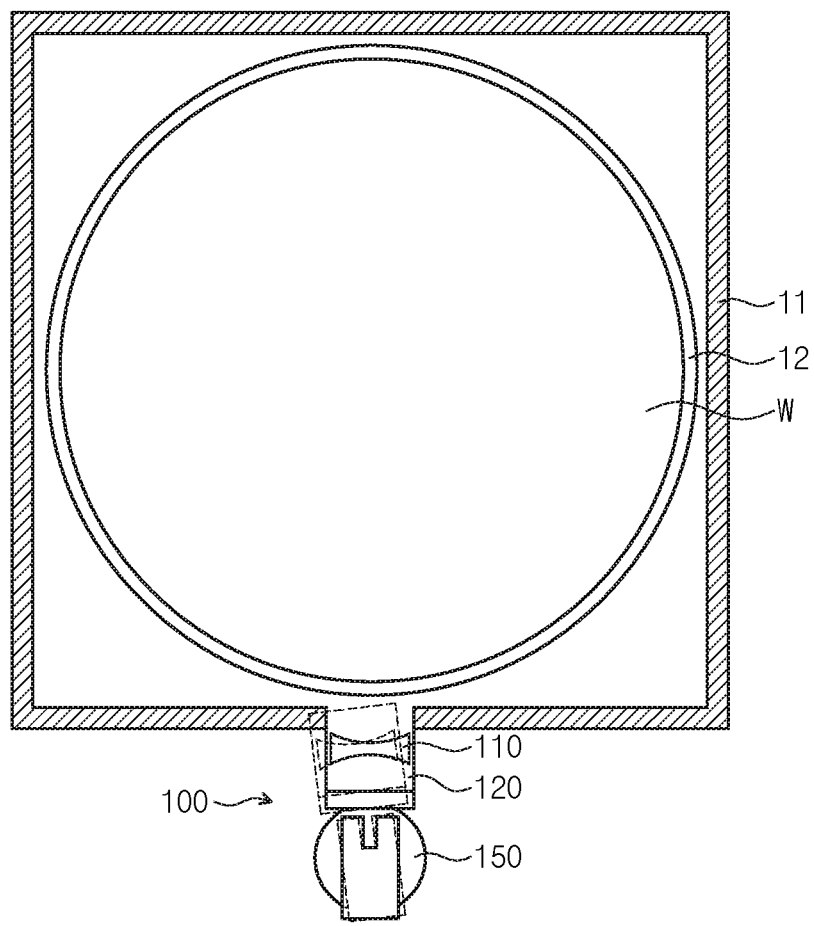
FIG. 10 is a view of an apparatus for optical emission spectroscopy according to another embodiment of the inventive concept.

FIG. 10 is a view of an apparatus 100 for OES according to another embodiment of the inventive concept. Referring to FIG. 10, the apparatus 100 for the OES may include a rotating unit 150 for rotating a light collection part constituting a light collection unit 110 in a horizontal direction (a left/right direction). Here, an analysis unit 130 may analyze a plasma state for each of rotation angles of the light collection part. According to the embodiment of FIG. 10, the plasma state maybe analyzed for each of various area of a wafer.

Figure 11:
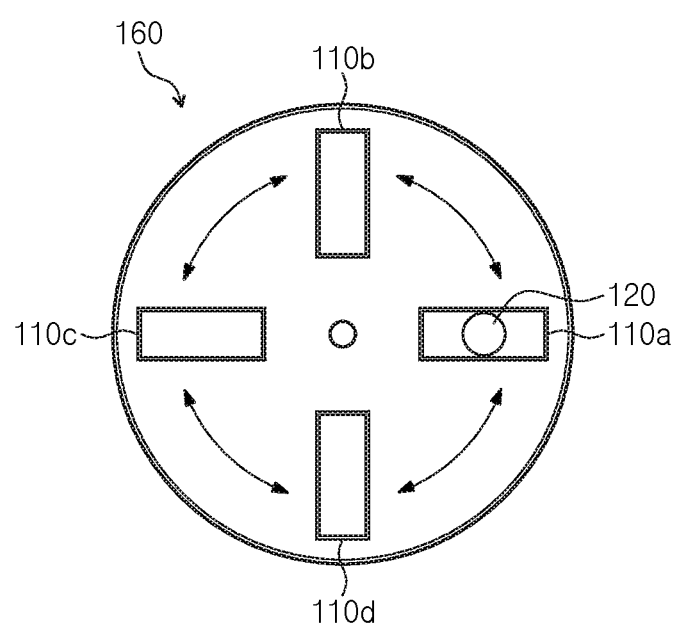
FIG. 11 is a view of an apparatus for optical emission spectroscopy according to another embodiment of the inventive concept.

FIG. 11 is a view of an apparatus 100 for OES according to another embodiment of the inventive concept. Referring to FIG. 11, a light collection part includes a plurality of light collectors having light incident angle ranges different from each other to correspond to sizes of a plurality of substrates. The apparatus 100 for the OES may include a driving unit 160 for moving a light collector, which has a light incident angle range corresponding to a size of a substrate disposed in a plasma process chamber 11, of a plurality of light collectors to a front side of a light transmission unit 120.

In an embodiment, the driving unit 160 may have a structure in which a concave lens (a light collector) having focus distances different from each other is attached to a rotation plate having light transmittance. Since the driving unit 160 drives the rotation plate by a motor to rotate the rotation plate, the light collector having a light incident angle range corresponding to a size of the substrate within the chamber 11 may be disposed on a front side of the light transmission unit 120. According to the embodiment of FIG. 11, the plasma state within the chamber 11 may be accurately and coadaptationally analyzed with respect to the substrate having various sizes.

Figure 12:
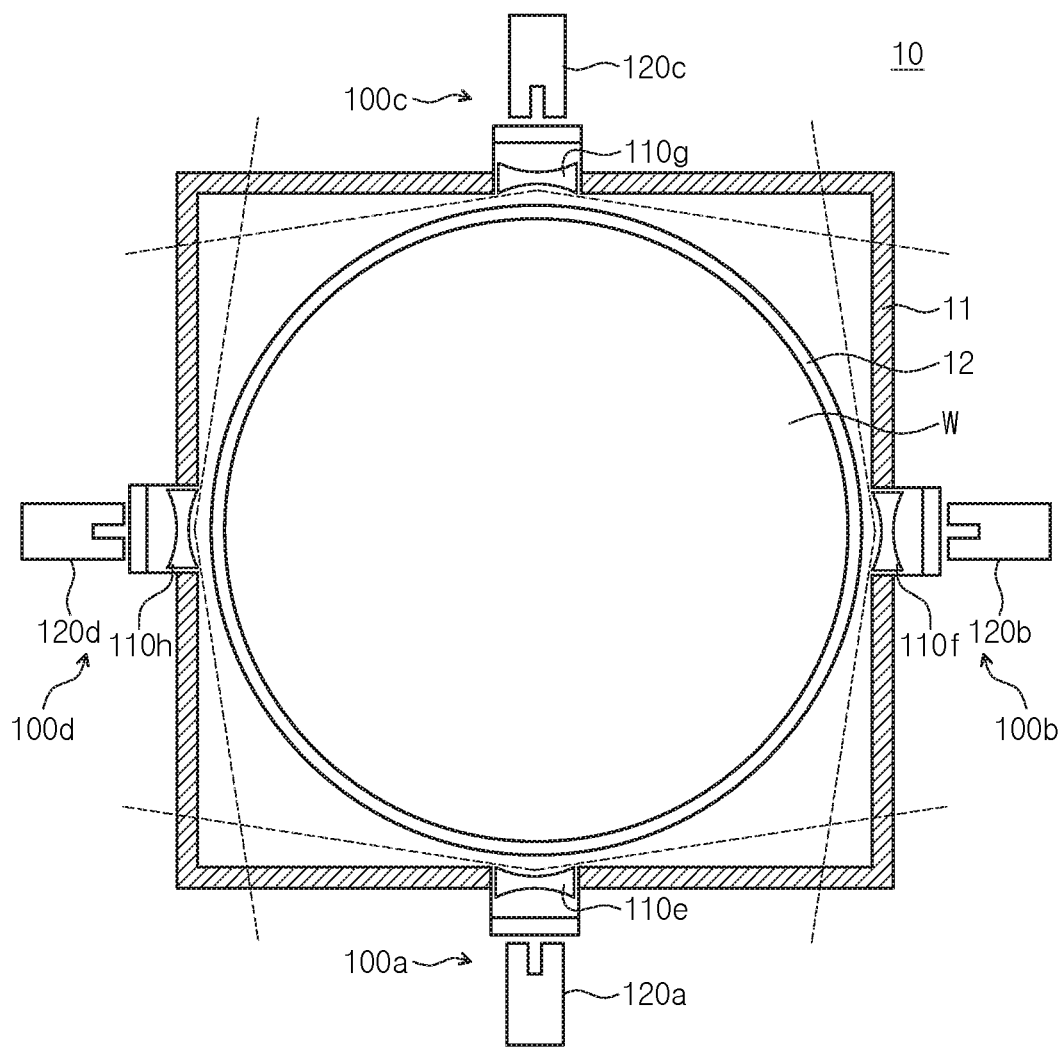
FIG. 12 is a view of an apparatus for optical emission spectroscopy according to another embodiment of the inventive concept.

FIG. 12 is a view of an apparatus 100 for optical emission spectroscopy according to another embodiment of the inventive concept. Referring to FIG. 12, the apparatus 100 for the OES may include a plurality of OES systems 100a, 100b, 100c, and 100d including a plurality of light collection units 110e, 110f, 110g, and 110h. The light collection unit 110 includes a plurality of light collection parts 110e, 110f, 110g, and 110h disposed at positions different from each other in a plasma process chamber. The plurality of light collection parts may have light incident angle ranges corresponding to substrates having sizes different from each other. According to the embodiment of FIG. 12, the plasma state within the chamber 11 may be accurately and coadaptationally analyzed with respect to the substrate having various sizes.

The apparatus for the OES according to the embodiments of the inventive concept may have high expandability and easiness and thus be easily added and mounted on the existing equipment using plasma. Thus, the abnormal state of the plasma may be previously detected and processed to reduce wafer scrap, thereby reducing producing costs. Also, the apparatus for the OES according to the embodiments of the inventive concept may analyze the plasma state with respect to all kinds of light that has an influence on the wafer. Also, the apparatus for the OES may not have an influence on a signal for setting existing end point detection (EPD) and thus be commonly used.

According to the embodiments of the inventive concept, the plasma state may be uniformly analyzed from the central portion to the outermost portion of the substrate to improve the analysis performance for the plasma state.

Also, according to the embodiments of the inventive concept, the processed lens may be inserted to the front of the optical fiber to expand the range for collecting the light within the plasma process chamber, thereby expanding the light reception angle.

Also, according to the embodiments of the inventive concept, in the existing OES, the concave lens that is specifically processed may be additionally inserted just to easily and accurately measure the general abnormal state in the entire region within the plasma process chamber.

Also, according to the embodiments of the inventive concept, the plasma state in the plasma process chamber may be generally or locally analyzed as needed, and also, the plasma state may be analyzed for each of various areas on the substrate. Thus, the plasma state on the large-scale substrate having a size of about 450 mm or more in addition to the substrates having sizes of about 200 mm and 300 mm may be accurately analyzed.

The effects of the inventive concept are not limited to the foregoing effects. Other effects thereof will be clearly understandable by those skilled in the art from this specification and the accompanying drawings.

Following embodiments are provided to help understanding of the inventive concept, but do not limit the scope of the inventive concept, and thus those with ordinary skill in the technical field of the present inventive concept pertains will be understood that the present inventive concept can be carried out in other specific forms without changing the technical idea or essential features. Therefore, the technical scope of protection of the inventive concept will be determined by the technical idea of the scope of the appended claims, and also will be understood as not being limited to the literal description in itself, but reaching the equivalent technical values of the inventive concept.

What is claimed is:

1. An apparatus for optical emission spectroscopy, comprising:
    a light collection unit configured to collect light within a plasma process chamber in which plasma is generated to process a substrate, the light collection unit comprising a concave lens;
    a light transmission unit configured to transmit the collected light; and
    an analysis unit configured to analyze the light provided through the light transmission unit, thereby analyzing a plasma state,
    wherein the light collection unit comprises a light collection part configured to concentrate the light generated in the plasma process chamber and provide the concentrated light to the light transmission unit,
    wherein the concave lens is configured to expand an incident angle range of light that is incident from the inside of the plasma process chamber to concentrate the light,
    wherein both a front surface of the concave lens facing the plasma process chamber and a rear surface opposite to the front surface of the concave lens are concave,
    wherein the concave lens has a structure in which a curvature thereof in a horizontal direction is greater than a curvature thereof in a vertical direction,
    wherein the concave lens has a front surface concave transverse section, a rear surface concave transverse section, and a rectangular vertical section,
    wherein the rear surface concave transverse section of the concave lens is concave in the horizontal direction opposite to the curvature of the front surface concave transverse section of the concave lens,
    wherein the horizontal direction is parallel to a top surface of the substrate, and the vertical direction is perpendicular to the top surface of the substrate, and
    wherein a cross-section of the concave lens that is parallel to the top surface of the substrate is curved, and a cross-section of the concave lens that is perpendicular to the top surface of the substrate is not curved.

2. The apparatus of claim 1, wherein the light transmission unit comprises an optical fiber.

3. The apparatus of claim 1, further comprising a driving unit configured to move the light collection part to a front side of the light transmission unit or displace the light collection part from the front side of the light transmission unit.

4. The apparatus of claim 1, further comprising a rotating unit configured to rotate the light collection part in the horizontal direction.

5. The apparatus of claim 4, wherein the analysis unit is configured to analyze a plasma state for each of rotational angles of the light collection part.

6. The apparatus of claim 1, wherein the light collection part comprises a plurality of light collectors having different light incident angle ranges corresponding to different sizes of a plurality of substrates, and
    the apparatus further comprises a driving unit configured to move the light collector, which has a light incident angle range corresponding to the size of the substrate disposed in the plasma process chamber, of the plurality of light collectors to a front side of the light transmission unit.

7. The apparatus of claim 1, wherein the light collection unit comprises a plurality of light collection parts that are disposed at positions different from each other in the plasma process chamber, and
    the plurality of light collection parts have light incident angle ranges corresponding to different sizes of substrates.

8. The apparatus of claim 1, wherein the concave lens is configured to expand the incident angle range of light generated directly above the surface of the substrate.

9. An apparatus for optical emission spectroscopy, comprising:
    a light collection unit configured to collect light within a plasma process chamber in which plasma is generated to process a substrate, the light collection unit comprising a concave lens; and
    a light transmission unit configured to transmit the collected light to an analysis unit configured to analyze a plasma state,
    wherein the light collection unit comprises a light collection part configured to concentrate the light generated in the plasma process chamber and provide the concentrated light to the light transmission unit,
    wherein the concave lens is configured to expand an incident angle range of light that is incident from the inside of the plasma process chamber to concentrate the light,
    wherein both front surface of the concave lens facing the plasma process chamber and rear surface opposite to the front surface of the concave lens are concave,
    wherein the concave lens has a structure in which a curvature thereof in a horizontal direction is greater than that thereof in a vertical direction,
    wherein the concave lens has a front surface concave transverse section, a rear surface concave transverse section, and a rectangular vertical section,
    wherein the rear surface concave transverse section of the concave lens is concave in the horizontal direction opposite to the curvature of the front surface concave transverse section of the concave lens,
    wherein the horizontal direction is parallel to a top surface of the substrate, and the vertical direction is perpendicular to the top surface of the substrate, and
    wherein a cross-section of the concave lens that is parallel to the top surface of the substrate is curved, and a cross-section of the concave lens that is perpendicular to the top surface of the substrate is not curved.

10. The apparatus of claim 9, wherein the concave lens is configured to expand the incident angle range of light generated directly above the surface of the substrate.

11. A plasma processing apparatus comprising:
a plasma process chamber in which plasma is generated to process a substrate;
a light collection unit configured to collect light within the plasma process chamber; and
a light transmission unit configured to transmit the collected light to an analysis unit configured to analyze a plasma state,
wherein the light collection unit comprises a concave lens configured to concentrate the light generated in the plasma process chamber and provide the concentrated light to the light transmission unit,
wherein the concave lens is configured to expand an incident angle range of light that is incident from the inside of the plasma process chamber to concentrate the light
wherein both front surface of the concave lens facing the plasma process chamber and rear surface opposite to the front surface of the concave lens are concave,
wherein the concave lens has a structure in which a curvature thereof in a horizontal direction is greater than that thereof in a vertical direction,
wherein the concave lens has a front surface concave transverse section, a rear surface concave transverse section, and a rectangular vertical section,
wherein the rear surface concave transverse section of the concave lens is concave in the horizontal direction opposite to the curvature of the front surface concave transverse section of the concave lens,
wherein the horizontal direction is parallel to a top surface of the substrate, and the vertical direction is perpendicular to the top surface of the substrate, and
wherein a cross-section of the concave lens that is parallel to the top surface of the substrate is curved, and a cross-section of the concave lens that is perpendicular to the top surface of the substrate is not curved.

12. The plasma processing apparatus of claim 11, wherein the concave lens is configured to expand the incident angle range of light generated directly above the surface of the substrate.

* * * * *